(12) United States Patent
Clark

(10) Patent No.: US 12,362,304 B2
(45) Date of Patent: Jul. 15, 2025

(54) BONDING LAYER AND PROCESS OF MAKING

(71) Applicant: Tokyo Electron Limited, Tokyo (JP)

(72) Inventor: Robert D. Clark, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 503 days.

(21) Appl. No.: 17/876,151

(22) Filed: Jul. 28, 2022

(65) Prior Publication Data

US 2023/0062465 A1 Mar. 2, 2023

Related U.S. Application Data

(60) Provisional application No. 63/240,312, filed on Sep. 2, 2021.

(51) Int. Cl.
*H01L 23/00* (2006.01)
*H01L 25/065* (2023.01)

(52) U.S. Cl.
CPC .............. *H01L 24/08* (2013.01); *H01L 24/03* (2013.01); *H01L 24/05* (2013.01); *H01L 24/80* (2013.01); *H01L 25/0657* (2013.01); *H01L 2224/0341* (2013.01); *H01L 2224/03444* (2013.01); *H01L 2224/05541* (2013.01); *H01L 2224/05578* (2013.01); *H01L 2224/05624* (2013.01); *H01L 2224/05687* (2013.01); *H01L 2224/0801* (2013.01); *H01L 2224/08145* (2013.01); *H01L 2224/08501* (2013.01); *H01L 2224/80203* (2013.01); *H01L 2224/80232* (2013.01); *H01L 2224/80895* (2013.01); *H01L 2224/80896* (2013.01); *H01L 2224/80948* (2013.01); *H01L 2225/06524* (2013.01); *H01L 2225/06527* (2013.01)

(58) Field of Classification Search
None
See application file for complete search history.

(56) References Cited

U.S. PATENT DOCUMENTS

| | | |
|---|---|---|
| 2008/0185724 A1 | 8/2008 | Tseng et al. |
| 2010/0117240 A1* | 5/2010 | Cichocki ................. H01L 24/05 257/E21.24 |
| 2015/0243629 A1 | 8/2015 | Herbots et al. |
| 2017/0358553 A1 | 12/2017 | Kim et al. |
| 2019/0051623 A1* | 2/2019 | Das ........................ H01L 24/13 |
| 2020/0006284 A1 | 1/2020 | Chen et al. |

FOREIGN PATENT DOCUMENTS

KR 1020180086013 A 7/2018

OTHER PUBLICATIONS

International Search Report and Written Opinion on PCT App. PCT/US2022/042111 dated Dec. 14, 2022 (10 pages).

* cited by examiner

*Primary Examiner* — Erik T. K. Peterson
(74) *Attorney, Agent, or Firm* — Foley & Lardner LLP

(57) ABSTRACT

A process for forming a semiconductor package is disclosed. The process includes providing a first substrate including a first dielectric layer. The process includes overlaying a first surface of the first dielectric layer with a first bonding layer that includes aluminum. The process includes providing a second substrate including a second dielectric layer. The process includes overlaying a second surface of the second dielectric layer with a second bonding layer that includes alkoxy-siloxide. The process includes forming a third bonding layer by combining the first bonding layer and the second bonding layer so as to bond the first substrate to the second substrate.

13 Claims, 7 Drawing Sheets

BONDING LAYER AND PROCESS OF MAKING

CROSS-REFERENCE TO RELATED APPLICATIONS

The present application claims the benefit of and priority to U.S. Provisional Patent Application No. 63/240,312, filed Sep. 2, 2021, and entitled "Bonding Layer and Process of Making," the contents of which is incorporated by reference in its entirety for all purposes.

FIELD OF THE DISCLOSURE

This disclosure relates to microelectronic devices including semiconductor devices, transistors, and integrated circuits, including methods of microfabrication.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, and greater bandwidth, as well as lower power consumption and latency has grown recently, there has grown a need for smaller and more creative packaging techniques of semiconductor dies.

SUMMARY

Wafer-to-wafer and chip-to-chip bonding is being implemented to continue Power-Performance-Area-Cost (PPAC) scaling for complex circuits such as are implemented in Systems on Chip (SOCs). Many bonding techniques utilize oxide-to-oxide bonding adhesion and form integrated interconnect structures through a hybrid bonding technique that enables interconnections to be formed at the bond interface between two wafers or dies. However, current technologies typically form a permanent electrical connection between the respective interconnect structures of bonded wafers/dies. Stated another way, the existing interconnect structures of bonded wafers/dies are not capable of being switched between a connected state and a disconnected state.

The present disclosure provides various embodiments of respective interconnect structures of two wafers (or dies) that can be electrically connected to each other through a combination of two selectively grown bonding layers. For example, a first wafer may include a first substrate with a first dielectric layer (e.g., having an oxide surface) formed thereon, and the second wafer may include a second substrate with a second dielectric layer (e.g., also having an oxide surface) formed thereon. Within the first dielectric layer, a number of first interconnect structure are formed therein, and within the second dielectric layer, a number of second interconnect structure are formed therein. One of the oxide surfaces, but not both, is treated such that a first bonding layer that includes aluminum is selectively formed thereon. The other oxide surface is treated such that a second bonding layer that includes silicon alkoxides is selectively formed thereon. Based on combining the first and second bonding layers, the first substrate can be coupled to the second substrate, with each of the first interconnect structures in physical contact with a corresponding one of the second interconnect structures.

One aspect of the present disclosure may be directed to a structure (e.g., a semiconductor package). The structure may include a first substrate; a second substrate; and a bonding layer comprising AlSiO bonding the first substrate to the second substrate.

The first substrate comprises: a first dielectric layer disposed on the first substrate; and a first interconnect structure embedded in first dielectric layer with a first upper surface not overlaid by the first dielectric layer. The second substrate comprises: a second dielectric layer disposed on the second substrate; and a second interconnect structure embedded in second dielectric layer with a second upper surface not overlaid by the second dielectric layer.

The first interconnect structure contacts the second interconnect structure, with the first upper surface and the second upper surface in contact with each other. The bonding layer is around a portion of a collective sidewall of the contacted first and second interconnect structures. The bonding layer extends between only the first dielectric layer and the second dielectric layer. The first substrate comprises a first device structure overlaid by the first dielectric layer, wherein the first device structure is electrically coupled to the first interconnect structure, and wherein the second substrate comprises a second device structure overlaid by the second dielectric layer, wherein the second device structure is electrically coupled to the second interconnect structure. The bonding layer has a thickness less than about 4 nanometers.

Another aspect of the present disclosure may be directed to a process for forming a semiconductor package. The process may include providing a first substrate including a first dielectric layer. The process includes overlaying a first surface of the first dielectric layer with a first bonding layer that includes aluminum. The process includes providing a second substrate including a second dielectric layer. The process includes overlaying a second surface of the second dielectric layer with a second bonding layer that includes alkoxy-siloxide. The process includes forming a third bonding layer by combining the first bonding layer and the second bonding layer so as to bond the first substrate to the second substrate.

The process further includes applying a vapor or liquid phase of trimethyl aluminum over the second surface to form the second bonding layer.

The process further includes applying a vapor or liquid phase of dimethyl aluminum iso-propoxide over the second surface to form the second bonding layer.

The process further includes applying a vapor or liquid phase of tris(tert-pentoxy)silicon(dimethylamide) over the second surface to form the second bonding layer.

The process further includes physically contacting the first bonding layer with the second bonding layer; and annealing at least the contacted first and second bonding layers at an elevated temperature to form the third bonding layer. The elevated temperature is less than about 500 Celsius degrees. Annealing at least the contacted first and second bonding layers causes the aluminum of the first bonding layer to catalyze rearrangement of alkoxide ligands of the second bonding layer via a beta-elimination process.

Each of the first bonding layer and the second bonding layer has a thickness thinner than about 2 nanometers.

The first dielectric layer embeds a first interconnect structure with its first upper surface not overlaid by the first dielectric layer or the first bonding layer, and the second dielectric layer embeds a second interconnect structure with its second upper surface not overlaid by the second dielectric layer or the second bonding layer. Concurrently with forming the third bonding layer, the process further includes physically contacting the first upper surface of the first interconnect structure with the second upper surface of the second interconnect structure.

Yet another aspect of the present disclosure may be directed to a process for forming a semiconductor package. The process may include forming a first dielectric layer over a first substrate, wherein the first dielectric layer embeds a first interconnect structure; overlaying a first surface of the first dielectric layer with a first bonding layer that includes aluminum; forming a second dielectric layer over a second substrate, wherein the second dielectric layer embeds a second interconnect structure; overlaying a second surface of the second dielectric layer with a second bonding layer that includes alkoxy-siloxide; and connecting the first interconnect structure to the second interconnect structure based on combining the first bonding layer and the second bonding layer.

Combining the first bonding layer and the second bonding layer further comprises physically contacting the first bonding layer with the second bonding layer; and annealing at least the contacted first and second bonding layers at an elevated temperature to form a third bonding layer that comprises AlSiO.

The elevated temperature is less than about 500 Celsius degrees.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
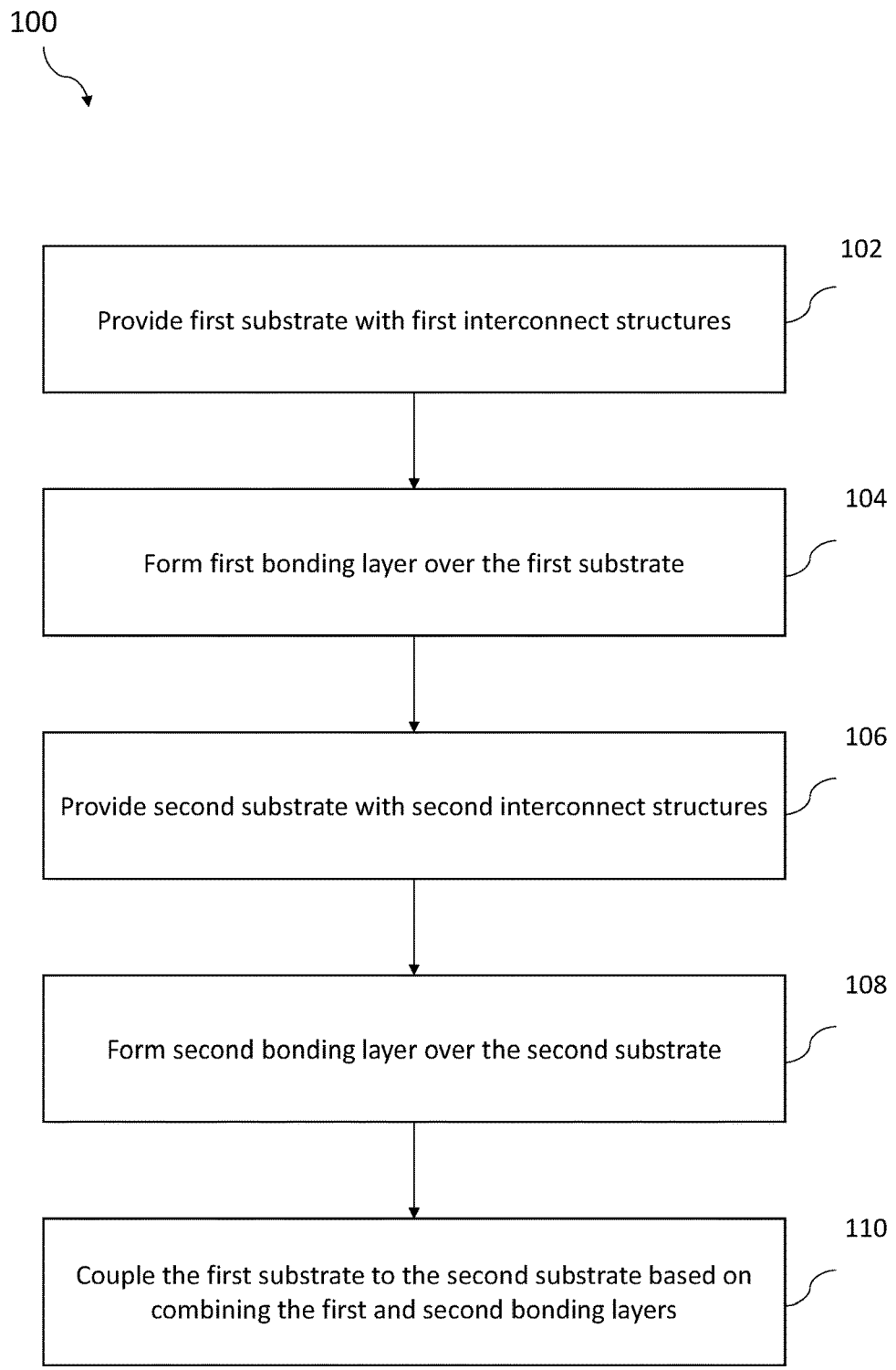
FIG. 1 illustrates a flow chart of an example method for making a semiconductor package, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

According to one implementation, a bonding layer is formed using a chemical bonding technology whereby each substrate is treated with a precursor that can be selectively applied only on dielectric areas. On bonding, these precursors chemically react with each other to create the bonding/glue layer between the substrates. By using a chemically driven process for bond formation, the temperature can be reduced over some conventional bonding techniques. The use of chemical surface treatments can be selectively formed on oxides or other insulating layers in order to not interfere with metal-metal contacts used to interconnect the substrates.

According to one process, a carrier wafer (or die) with an oxide surface over a semiconductor can be bonded to a substrate wafer (or die) with an oxide surface over a series of devices or surfaces. One of the oxide surfaces of the carrier oxide or the substrate oxide, but not both, is treated such that a thin layer comprising Al is formed on the surface. The other oxide surface is treated such that a thin surface layer comprising Si alkoxides is formed on the surface. As examples, the Al-containing layer (preferably Al oxide) may be 1-2 nanometers (nm) thick and the alkoxy-siloxide may be about 2 nm or less due to self-saturation at 1-2 monolayers. However, each of these layers may be below 1 nm thick. The substrate and the carrier are then bonded together by making physical contact between the oxide layers and annealing the substrate and the carrier under pressure. During the step of annealing under pressure, the Al on the first oxide surface catalyzes the rearrangement of the alkoxide ligands via a beta-elimination process in order to form Si—O—Si and Si—O—Al linkages by a process similar to sol-gel silica formation, which is well understood by those skilled in the art. This process can be performed at relatively low temperatures, e.g., at about 400-500° C. or lower.

FIG. 1 illustrates a flowchart of an example method 100 for forming a semiconductor package having at least two coupled (e.g., bonded) wafers, dies, or substrates based on two different bonding layers originally formed over the two substrates. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional views of an example semiconductor package 200 at various fabrication stages as shown in FIGS. 3 to 6, respectively, which will be discussed in further detail below. It should be understood that the semiconductor device 200, shown in FIGS. 3 to 6, may include a number of other devices such as inductors, fuses, capacitors, coils, etc., while remaining within the scope of the present disclosure.

Figure 2:
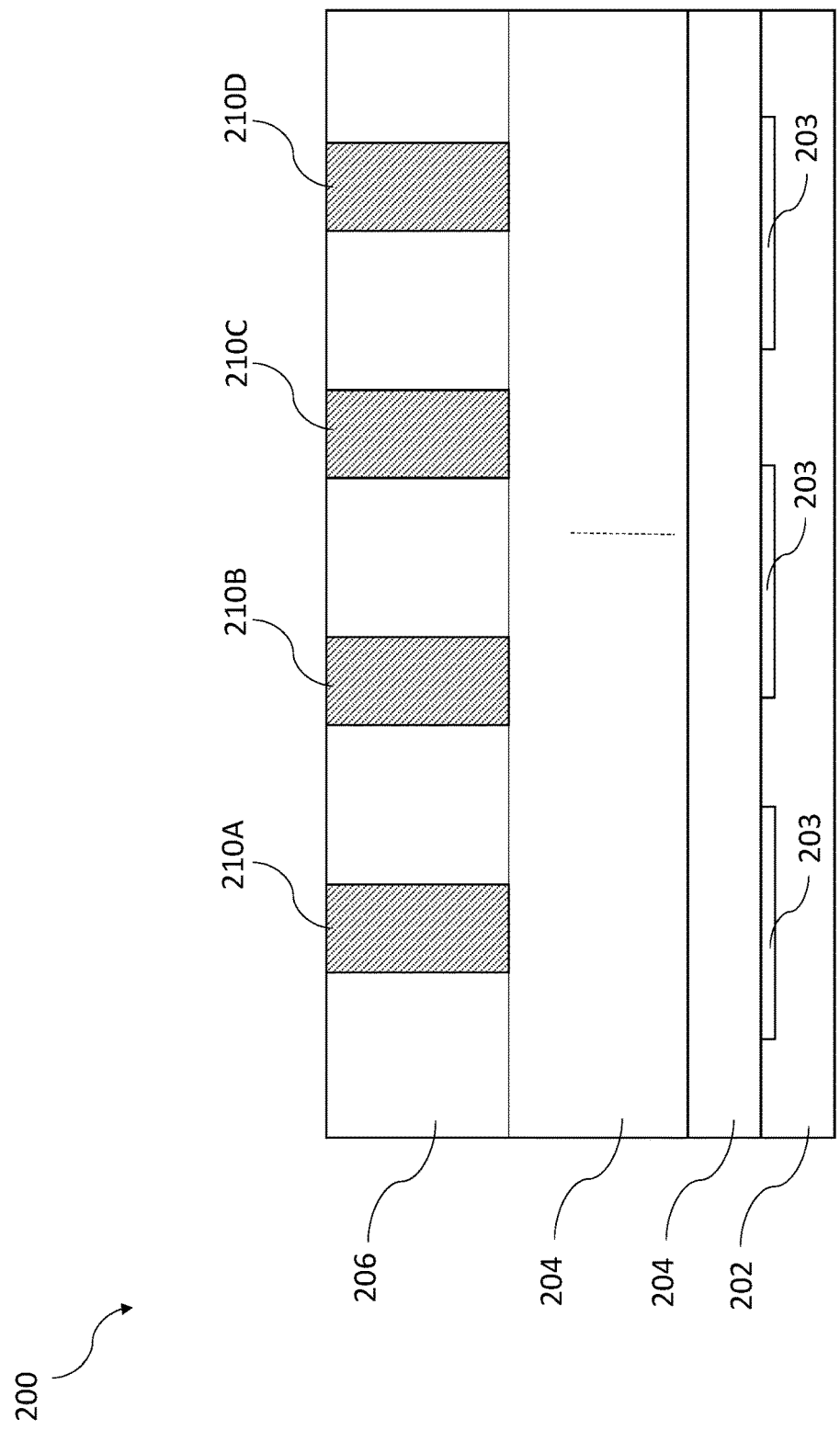
FIGS. 2 to 6 illustrate respective cross-sectional views of a semiconductor package during various fabrication stages, made by the method of FIG. 1, in accordance with some embodiments.

Corresponding to operation 102 of FIG. 1, FIG. 2 is a cross-sectional view of the semiconductor package 200 in which a first substrate 202 is provided with a number of first interconnect structures 210A, 210B, 210C, and 210D, at one of the various stages of fabrication, in accordance with various embodiments.

The first substrate 202 may be a semiconductor substrate, such as a bulk semiconductor, a semiconductor-on-insulator (SOI) substrate, or the like, which may be doped (e.g., with a p-type or an n-type dopant) or undoped. The first substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the first substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the first substrate 202 includes a number of device features/structures 203 (e.g., transistors, diodes, resistors, etc., which are not shown for the sake of clarity) formed along a (e.g., frontside) surface of the first substrate 202 and a number of interconnect structures (e.g., metal lines, metal vias, etc., which are not shown for the sake of clarity) formed over the device structures. The interconnect structures are configured to electrically connect the device structures to one another so as to form an integrated circuit, which can function as a logic device, a memory device, an input/output device, or the like. These interconnect structures (e.g., formed of conductive materials, such as Cu, Al, W, Ti, TiN, Ta, TaN, or multiple layers or combinations thereof) may be embedded in one or more dielectric layers (e.g., formed of low-k dielectric materials, such as $SiO_2$), which are sometimes referred to as metallization layers, e.g., 204. Alternatively stated, each metallization layer 204 can include a number of metal lines and a number of metal vias embedded therein. Over the (e.g., frontside) surface of the first substrate 202, a plural number of such metallization layers 204 can be formed.

Further, on a topmost one of the metallization layers, a surface dielectric layer 206 is formed. In some embodiments, the surface dielectric layer 206, formed of one or more low-k dielectric materials, such as $SiO_2$, has a number of first interconnect structures 210A to 210D disposed therein. The first interconnect structures 210A to 210D are formed using a damascene process, wherein a blanket dielectric material of the surface dielectric layer 206 is deposited over the workpiece (e.g., the topmost metallization layer), and the dielectric material is patterned using lithography. The patterned dielectric material is filled with a conductive material, and excess portions of the conductive material are removed from over the top surface of the dielectric material using a chemical mechanical polishing (CMP) process, an etch process, or combinations thereof. In other embodiments, a conductive material may be deposited and patterned using lithography, and a dielectric material of the surface dielectric layer 206 is formed over the conductive material to form the first interconnect structures 210A to 210D using a subtractive etch process. The excess dielectric material is then removed from over the first interconnect structures 210A to 210D using a CMP process, an etch process, or combinations thereof.

Figure 3:
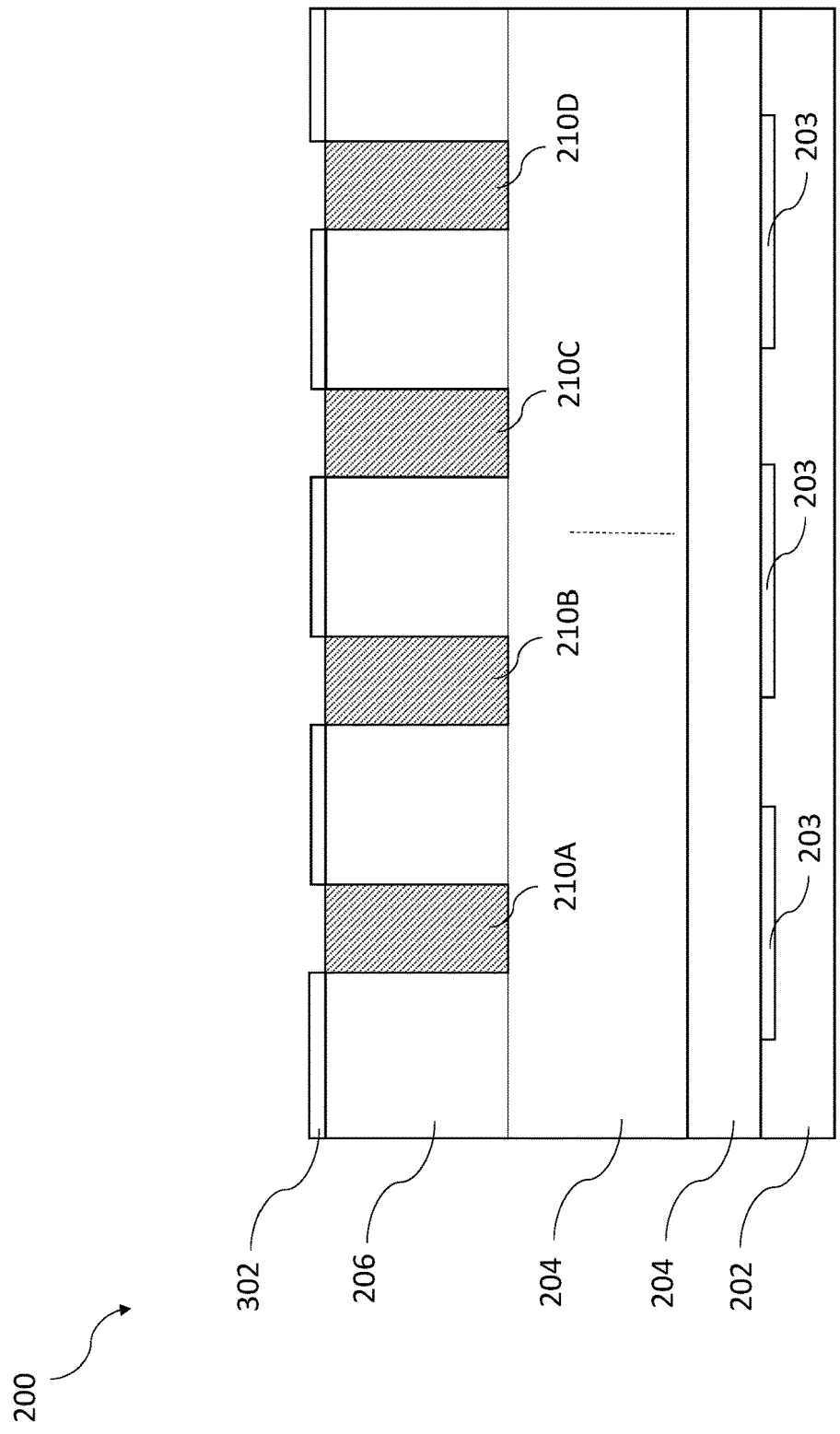

Corresponding to operation 104 of FIG. 1, FIG. 3 is a cross-sectional view of the semiconductor package 200 in which a first bonding layer 302 is selectively formed over the surface dielectric layer 206, at one of the various stages of fabrication, in accordance with various embodiments.

Following the formation of the first interconnect structures 210A to 210D, at least one deposition process is performed to selectively form the first bonding layer 302 over the surface dielectric layer 206. As shown, the first bonding layer 302 may only be formed on the region where the surface dielectric layer 206 is present. Stated another way, the first bonding layer 302 may not be formed over the exposed surface of any of the first interconnect structures 210A to 210D. In various embodiments, the first bonding layer 302, including alkoxy-siloxide, is formed by using a vapor or liquid phase surface treatment on the surface dielectric layer 206. For instance, tris(tert-pentoxy)silicon (dimethylamide), or similar compound/complex materials, may react selectively with OH groups on one or more surface of the surface dielectric layer 206 (e.g., the portions of surface of the surface dielectric layer 206 laterally next to the exposed surfaces of the first interconnect structures 210A to 210D). In various embodiments, the first bonding layer 302 may have a thickness of about 2 nanometers or less due to self-saturation at 1-2 monolayers.

Figure 4:
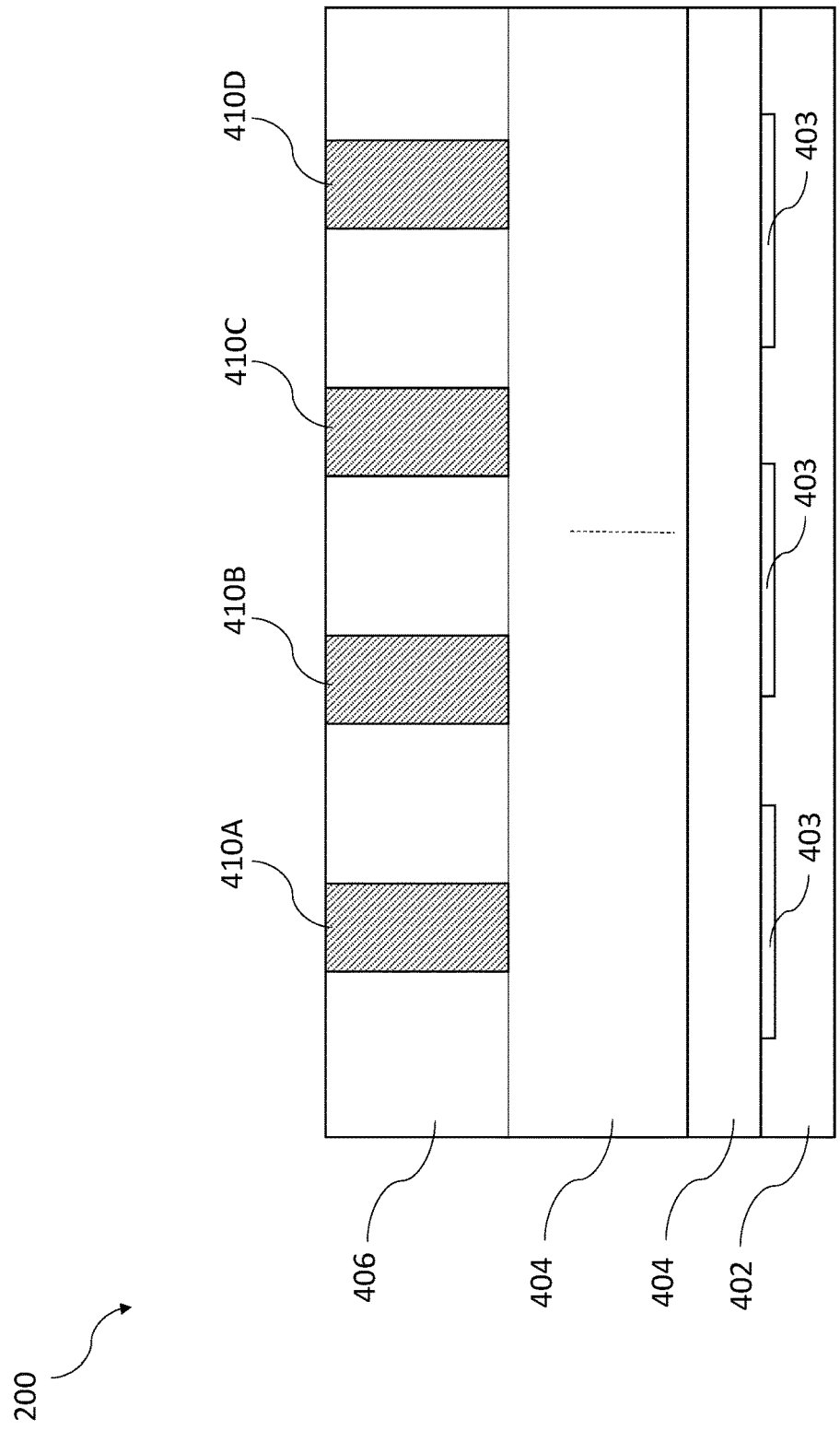

Corresponding to operation 106 of FIG. 1, FIG. 4 is a cross-sectional view of the semiconductor package 200 in which a second substrate 402 is provided with a number of second interconnect structures 410A, 410B, 410C, and 410D, at one of the various stages of fabrication, in accordance with various embodiments.

The second substrate 402 may be a semiconductor substrate, such as a bulk semiconductor, a semiconductor-on-insulator (SOI) substrate, or the like, which may be doped (e.g., with a p-type or an n-type dopant) or undoped. The second substrate 402 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the second substrate 402 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the second substrate 402 includes a number of device features/structures 403 (e.g., transistors, diodes, resistors, etc., which are not shown for the sake of clarity) formed along a (e.g., frontside) surface of the second substrate 402 and a number of interconnect structures (e.g., metal lines, metal vias, etc., which are not shown for the sake of clarity) formed over the device structures. The interconnect structures are configured to electrically connect the device structures to one another so as to form an integrated circuit, which can function as a logic device, a memory device, an input/output device, or the like. These interconnect structures (e.g., formed of conductive materials, such as Cu, Al, W, Ti, TiN, Ta, TaN, or multiple layers or combinations thereof) may be embedded in one or more dielectric layers (e.g., formed of low-k dielectric materials, such as $SiO_2$), which are sometimes referred to as metallization layers, e.g., 404. Alternatively stated, each metallization layer 404 can include a number of metal lines and a number of metal vias embedded therein. Over the (e.g., frontside) surface of the second substrate 402, a plural number of such metallization layers 404 can be formed.

Further, on a topmost one of the metallization layers, a surface dielectric layer 406 is formed. In some embodiments, the surface dielectric layer 406, formed of one or more low-k dielectric materials, such as $SiO_2$, has a number of second interconnect structures 410A to 410D disposed therein. The second interconnect structures 410A to 410D are formed using a damascene process, wherein a blanket dielectric material of the surface dielectric layer 406 is deposited over the workpiece (e.g., the topmost metallization layer), and the dielectric material is patterned using lithography. The patterned dielectric material is filled with a conductive material, and excess portions of the conductive material are removed from over the top surface of the dielectric material using a chemical mechanical polishing (CMP) process, an etch process, or combinations thereof. In other embodiments, a conductive material may be deposited and patterned using lithography, and a dielectric material of the surface dielectric layer 406 is formed over the conductive material to form the second interconnect structures 410A to 410D using a subtractive etch process. The excess dielectric material is then removed from over the second interconnect structures 410A to 410D using a CMP process, an etch process, or combinations thereof.

Figure 5:
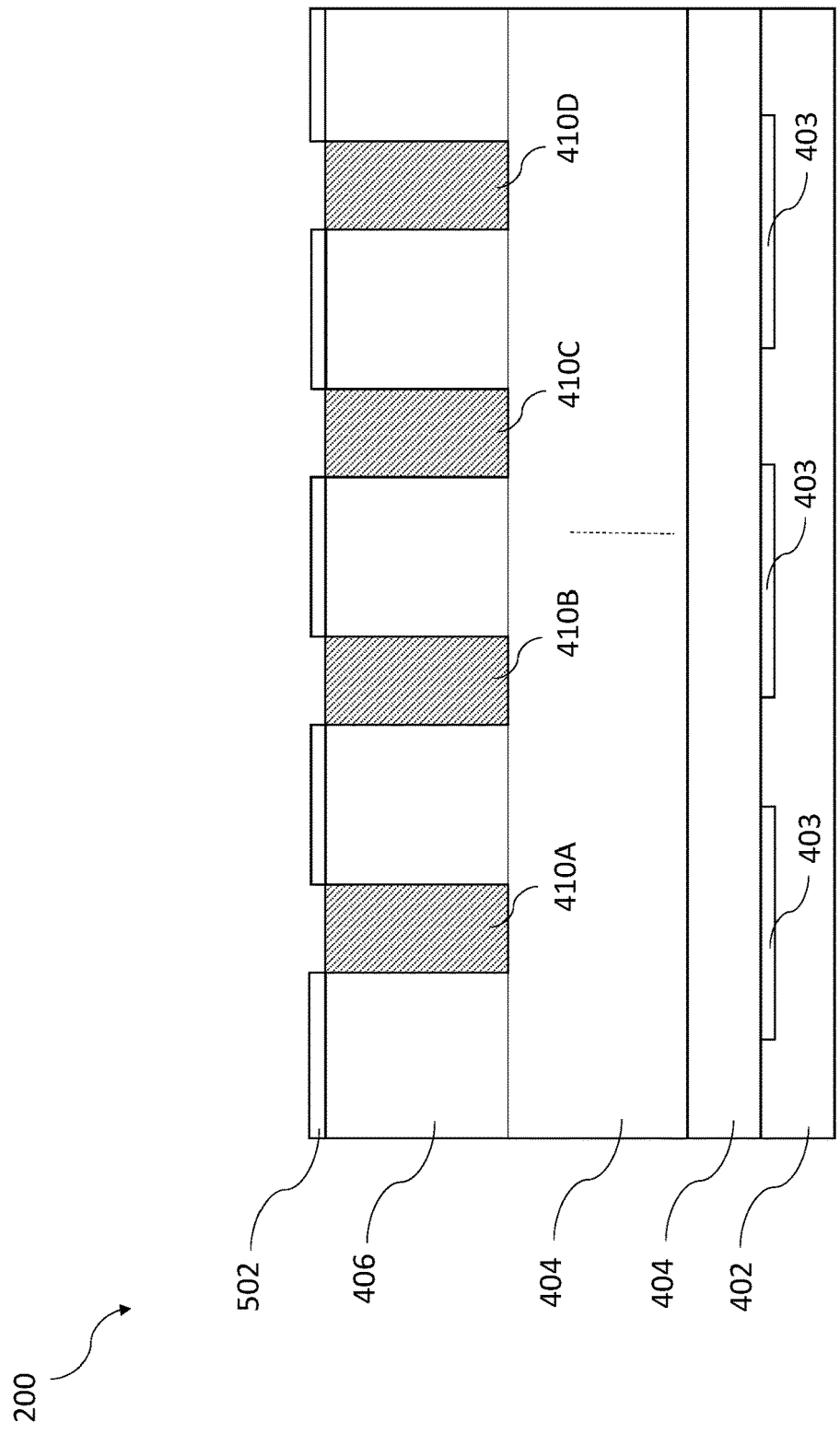

Corresponding to operation 108 of FIG. 1, FIG. 5 is a cross-sectional view of the semiconductor package 200 in which a second bonding layer 502 is selectively formed over the surface dielectric layer 406, at one of the various stages of fabrication, in accordance with various embodiments.

Following the formation of the second interconnect structures 410A to 410D, at least one deposition process is performed to selectively form the second bonding layer 502 over the surface dielectric layer 406. As shown, the second bonding layer 502 may only be formed on the region where the surface dielectric layer 406 is present. Stated another way, the second bonding layer 502 may not be formed over the exposed surface of any of the second interconnect structures 410A to 410D. In various embodiments, the second bonding layer 502, including aluminum (Al), is formed by treating one or more surfaces of the surface dielectric layer 406 (e.g., the portions of surface of the surface dielectric layer 406 laterally next to the exposed surfaces of the second interconnect structures 410A to 410D) with an Al precursor in the liquid or vapor phase. For instance, trimethyl aluminum or dimethyl aluminum isopropoxide may be used as the precursor. In various embodiments, the second bonding layer 502 may have a thickness of about 1 nanometer to about 2 nanometers.

Figure 6:
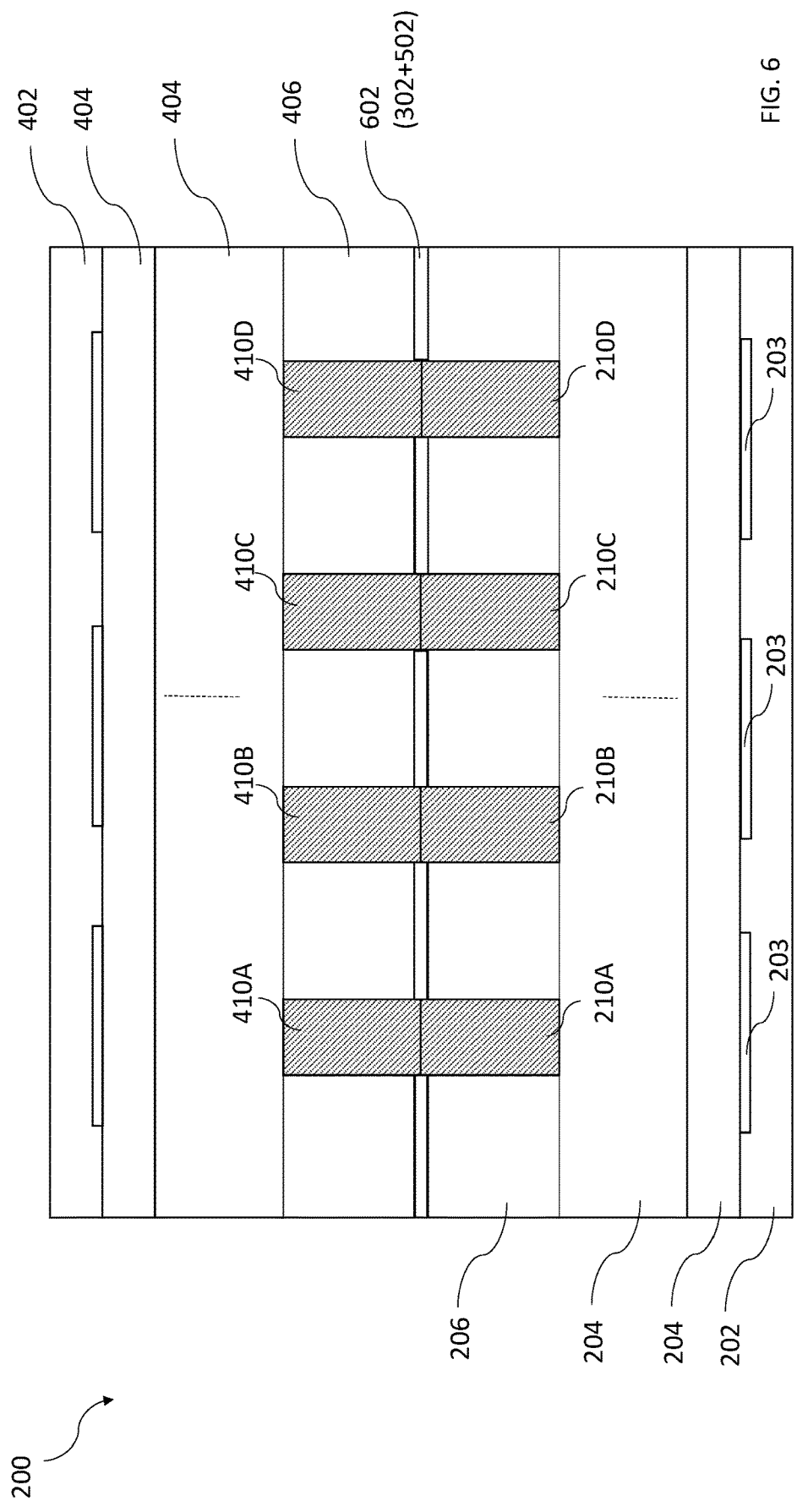

Corresponding to operation 110 of FIG. 1, FIG. 6 is a cross-sectional view of the semiconductor package 200 in which the first substrate 202 (the first semiconductor die) is coupled to the second substrate 402 (or the second semiconductor die), at one of the various stages of fabrication, in accordance with various embodiments.

In some embodiments, the first semiconductor die and the second semiconductor die are bonded together using a hybrid bonding process by coupling a top surface of the first semiconductor die (e.g., the top surface of the first bonding layer 302) to a top surface of the second semiconductor die (e.g., the top surface of the second bonding layer 502). For example, the second semiconductor die is inverted, i.e., rotated 180 degrees, from the view shown in FIG. 6. Next, the first interconnect structures 210A to 210D of the first semiconductor die are aligned with the second interconnect structures 410A to 410D of the second semiconductor die, respectively. The alignment of the first and second semiconductor dies may be achieved using optical sensing, as an example. The top surfaces of portions of the first bonding layer 302 (that are elevated from the top surfaces of the first interconnect structures 210A to 210D) are also aligned with the top surfaces of portions of the second bonding layer 502 (that are elevated from the top surfaces of the second interconnect structures 410A to 410D).

After the alignment process of the first and second semiconductor dies, the first and second semiconductor dies are hybrid bonded together by applying pressure and heat. In various embodiments, the Al of the second bonding layer 502 can catalyze, through beta-H elimination, the alkoxysiloxide of the first bonding layer 302, thereby forming a third bonding layer 602 (e.g., including AlSiO) bonded to and sandwiched between the substrates. With the first bonding layer 302 and second bonding layer 502 each being formed with a thickness less than 2 nanometers, the third bonding layer 602 may have a thickness less than about 4 nm, in some embodiments. The pressure applied may comprise a pressure of less than about 30 MPa, and the heat applied may comprise an anneal process at a temperature of about 100 to 500 degrees C., as examples, although alternatively, other amounts of pressure and heat may be used for the hybrid bonding process. The hybrid bonding process may be performed in a $N_2$ environment, an Ar environment, a He environment, an (about 4 to 10% $H_2$)/(about 90 to 96% inert gas or $N_2$) environment, an inert-mixing gas environment, combinations thereof, or other types of environments.

The hybrid bonding process results in the third bonding layer 602 formed between the surface dielectric layers 206 and 406, with the first interconnect structure 210A to 210D connected to the second interconnect structures 410A to 410D, respectively. That is, a number of non-metal-to-non-metal bonds are respectively formed between the portions of the surface dielectric layers 206 and 406 (through the third bonding layer 602), and a number of metal-to-metal bonds are respectively formed between the first interconnect structure 210A to 210D and the second interconnect structures 410A to 410D. A portion of the hybrid bonding process may comprise a fusion process that forms the non-metal-to-non-metal bonds, and a portion of the hybrid bonding process may comprise a copper-to-copper bonding process that forms the metal-to-metal bonds, for example. The term "hybrid" refers to the formation of the two different types of bonds using a single bonding process, rather than forming only one type of the bonds, as is the practice in other types of wafer-to-wafer or die-to-die bonding processes, for example.

Figure 7:
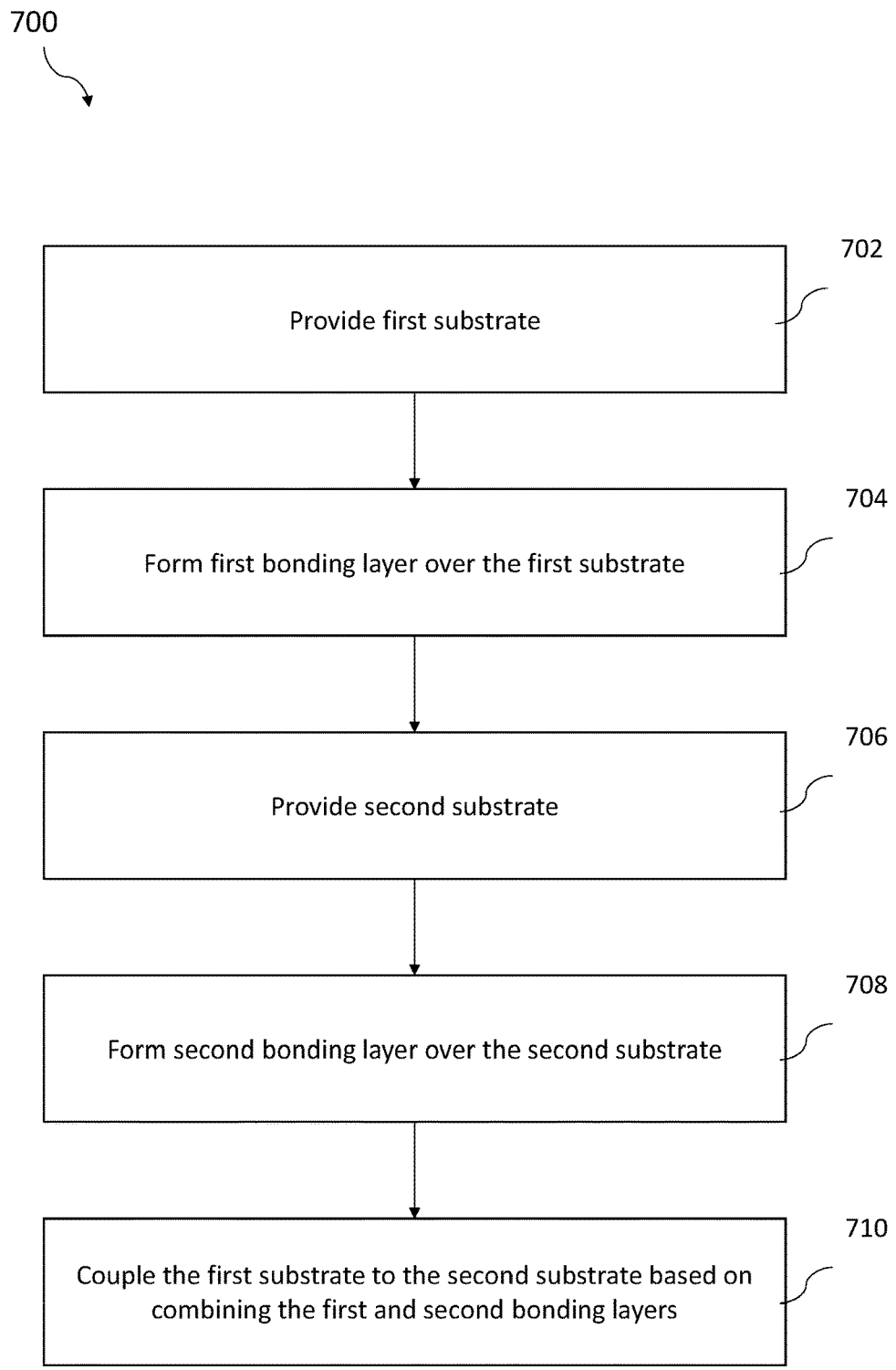
FIG. 7 illustrates a flow chart of another example method for making a semiconductor package, in accordance with some embodiments.

FIG. 7 illustrates a flowchart of another example method 700 for forming a semiconductor package having at least two coupled (e.g., bonded) wafers, dies, or substrates based on two different bonding layers originally formed over the two substrates. It is noted that the method 700 is substantially similar to the method 100 of FIG. 1 except that the method 700 may not include a hybrid bonding process. Accordingly, operations of the method 700 of FIG. 7 may only be briefly described as follows.

For example, the method 700 starts with operation 702 in which a first substrate is provided. The first substrate may be overlaid by a first dielectric layer formed of one or more low-k dielectric materials, such as $SiO_2$. The method 700 proceeds to operation 704 in which a first bonding layer is formed over the first substrate (e.g., in contact with the first dielectric layer). The first bonding layer, including alkoxysiloxide, is formed by using a vapor or liquid phase surface treatment on the first dielectric layer. For instance, tris(tert-pentoxy)silicon(dimethylamide), or similar compound/complex materials, may react selectively with OH groups on a top surface of the first dielectric layer. The method 700 proceeds to operation 706 in which a second substrate is provided. The second substrate may also be overlaid by a second dielectric layer formed of one or more low-k dielectric materials, such as $SiO_2$. The method 700 proceeds to operation 708 in which a second bonding layer is formed over the second substrate (e.g., in contact with the second dielectric layer). The second bonding layer, including aluminum (Al), is formed by treating a top surface of the second dielectric layer with an Al precursor in the liquid or vapor phase. For instance, trimethyl aluminum or dimethyl aluminum iso-propoxide may be used as the precursor. The method 700 then proceeds to operation 710 in which the first substrate is coupled to the second substrate based on combining the first bonding layer and the second bonding layer. The combined bonding layers (e.g., a single bonding layer) may include AlSiO, in accordance with various embodiments.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A process, comprising:
   providing a first substrate including a first dielectric layer;
   overlaying a first surface of the first dielectric layer with a first bonding layer that includes aluminum;
   providing a second substrate including a second dielectric layer;
   overlaying a second surface of the second dielectric layer with a second bonding layer that includes alkoxysiloxide; and
   forming a third bonding layer by combining the first bonding layer and the second bonding layer so as to bond the first substrate to the second substrate.

2. The process of claim 1, further comprising applying a vapor or liquid phase of trimethyl aluminum over the second surface to form the second bonding layer.

3. The process of claim 1, further comprising applying a vapor or liquid phase of dimethyl aluminum iso-propoxide over the second surface to form the second bonding layer.

4. The process of claim 1, further comprising applying a vapor or liquid phase of tris(tert-pentoxy)silicon(dimethylamide) over the second surface to form the second bonding layer.

5. The process of claim 1, further comprising:
   physically contacting the first bonding layer with the second bonding layer; and
   annealing at least the contacted first and second bonding layers at an elevated temperature to form the third bonding layer.

6. The process of claim 5, wherein the elevated temperature is less than about 500 Celsius degrees.

7. The process of claim 5, wherein annealing at least the contacted first and second bonding layers causes the aluminum of the first bonding layer to catalyze rearrangement of alkoxide ligands of the second bonding layer via a beta-elimination process.

8. The process of claim 1, wherein each of the first bonding layer and the second bonding layer has a thickness thinner than about 2 nanometers (nm).

9. The process of claim 1, wherein the first dielectric layer embeds a first interconnect structure with its first upper surface not overlaid by the first dielectric layer or the first bonding layer, and the second dielectric layer embeds a second interconnect structure with its second upper surface not overlaid by the second dielectric layer or the second bonding layer.

10. The process of claim 9, concurrently with forming the third bonding layer, further comprising physically contacting the first upper surface of the first interconnect structure with the second upper surface of the second interconnect structure.

11. A process, comprising:
    forming a first dielectric layer over a first substrate, wherein the first dielectric layer embeds a first interconnect structure;
    overlaying a first surface of the first dielectric layer with a first bonding layer that includes aluminum;
    forming a second dielectric layer over a second substrate, wherein the second dielectric layer embeds a second interconnect structure;
    overlaying a second surface of the second dielectric layer with a second bonding layer that includes alkoxysiloxide; and connecting the first interconnect structure to the second interconnect structure based on combining the first bonding layer and the second bonding layer.

12. The process of claim 11, wherein combing the first bonding layer and the second bonding layer further comprises:
   physically contacting the first bonding layer with the second bonding layer; and
   annealing at least the contacted first and second bonding layers at an elevated temperature to form a third bonding layer that comprises AlSiO.

13. The process of claim 12, wherein the elevated temperature is less than about 500 Celsius degrees.

* * * * *